(12) United States Patent
Qian et al.

(10) Patent No.: US 8,023,279 B2
(45) Date of Patent: Sep. 20, 2011

(54) FLMP BUCK CONVERTER WITH A MOLDED CAPACITOR AND A METHOD OF THE SAME

(75) Inventors: Qiuxiao Qian, Jiangsu (CN); Yong Liu, Scarborough, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 325 days.

(21) Appl. No.: 12/404,627

(22) Filed: Mar. 16, 2009

(65) Prior Publication Data
US 2010/0232131 A1     Sep. 16, 2010

Related U.S. Application Data

(60) Provisional application No. 61/159,562, filed on Mar. 12, 2009.

(51) Int. Cl.
*H05K 1/18* (2006.01)
(52) U.S. Cl. .................... 361/764; 361/782; 361/784
(58) Field of Classification Search .......... 361/782–784, 361/813; 174/520–523; 257/690–692, 778–780, 257/787–790
See application file for complete search history.

(56) References Cited

U.S. PATENT DOCUMENTS

| | | | | |
|---|---|---|---|---|
| 7,485,954 | B2 * | 2/2009 | Havanur | 257/686 |
| 7,554,181 | B2 * | 6/2009 | Satou et al. | 257/676 |
| 7,576,429 | B2 * | 8/2009 | Madrid et al. | 257/718 |

OTHER PUBLICATIONS

Hashimoto, T., et al. Hitachi Ltd., "SIP with Mounted Capacitor for Reduced Parasitic Inductance in Voltage Regulator", Proceedings of the 20th International Symposium on Power Semiconductor Devices & ICs, Orlando, FL May 18-22, 2008.

* cited by examiner

*Primary Examiner* — Tuan T Dinh
(74) *Attorney, Agent, or Firm* — Thomas R. FitzGerald, Esq.; Hiscock & Barclay, LLP (57) ABSTRACT

An encapsulated buck converter module includes a low side transistor and a control integrated circuit bonded to a first section on a first side of a leadframe, a first clip between a source of the low side transistor and a second section, a source contact of a high side transistor attached to the first section on a second side of the leadframe with a gate contact of the high side transistor attached to a third section, a conductive member attached to the first and second sections on the second side of the leadframe wherein the first side of the conductive member attached to the second conductive member forms a conductive path with a portion of a second side of the conductive member while any portion of the first side of the conductive member attached to the first component attachment section is insulated from the first side of the conductive member, a first plate of a capacitor attached to a drain contact of the high side transistor and a second plate of the capacitor attached to the second side of the conductive member, and means for forming an external connection to the drain contact of the high side transistor.

16 Claims, 14 Drawing Sheets

FLMP BUCK CONVERTER WITH A MOLDED CAPACITOR AND A METHOD OF THE SAME

CROSS-REFERENCE TO RELATED APPLICATIONS

This application claims the benefit of U.S. Provisional patent application No. 61/159,562 filed Mar. 12, 2009.

FIELD OF THE INVENTION

This invention relates to molded multiple die packages, and more particularly to a buck converter in a flip chip in a leaded and molded package (FLMP) with a capacitor inside the molded package.

BACKGROUND OF THE INVENTION

Buck converters are used as step down voltage regulators. The converters provide an output current through a series inductor that is usually driven by two switching transistors, one of which is connected to supply current to the inductor, and the other connected to draw current from the inductor. Because the buck converter is a switching type regulator the output voltage regulation is influenced by fluctuations in the input voltage to the regulator. Therefore, it is desirable to attenuate any fluctuations in the input voltage at the connections to the switching transistors.

The active devices of a buck converter, because of its relative simplicity compared to normal voltage regulators, can be integrated in a single molded package and therefore are often used in small electronic devices. However, there are other passive components needed for the converter, and integration of any one of these components into the molded package would be advantageous.

SUMMARY OF THE INVENTION

The invention comprises, in one form thereof, an encapsulated buck converter module with an integral capacitor comprising a low side transistor and a control integrated circuit bonded to a first component attachment section on a first side of a leadframe, a first clip between a source of the low side transistor and a second component attachment section. The encapsulated buck converter module further includes a source contact of a high side transistor attached to the first component attachment section on a second side of the leadframe with a gate contact of the high side transistor attached to a third component attachment section a conductive member attached to the first component attachment section and the second component attachment section on the second side of the leadframe wherein the first side of the conductive member attached to the second conductive member forms a highly conductive path with a portion of a second side of the conductive member while any portion of the first side of the conductive member attached to the first component attachment section is insulated from the first side of the conductive member a first plate of a capacitor attached to a drain contact of the high side transistor and a second plate of the capacitor attached to the second side of the conductive member, and means for forming an external connection to the drain contact of the high side transistor.

In still another form, the invention includes a method for forming an encapsulated buck converter module with an integral capacitor. The method comprises the steps of die bonding a low side transistor and a control integrated circuit to first component attachment section on a first side of a leadframe, attaching a first clip between a source of the low side transistor and a second component attachment section attaching wirebonds to the control integrated circuit. The method further comprises the steps of attaching on a second side of the leadframe a source contact of a high side transistor to the first component attachment section and a gate contact of the high side transistor to a third component attachment section, attaching to the second side of the leadframe a first side of a conductive member to the first component attachment section and the second component attachment section wherein the first side of the conductive member attached to the second conductive member forms a highly conductive path with a portion of a second side of the conductive member while any portion of the first side of the conductive member attached to the first component attachment section is insulated from the first side of the conductive member, attaching a first plate of a capacitor to a drain contact of the high side transistor and a second plate of the capacitor to the second side of the conductive member, attaching a first end of a second clip to the drain contact of the high side transistor, and encapsulating the leadframe is such a manner that part of the leadframe and a second end of the second clip is not encapsulated.

BRIEF DESCRIPTION OF THE DRAWINGS

The aforementioned and other features, characteristics, advantages, and the invention in general will be better understood from the following more detailed description taken in conjunction with the accompanying drawings, in which.

It will be appreciated that for purposes of clarity and where deemed appropriate, reference numerals have been repeated in the figures to indicate corresponding features. Also, the relative size of various objects in the drawings may in some cases have been distorted to more clearly show the invention.

DETAILED DESCRIPTION

Figure 1:
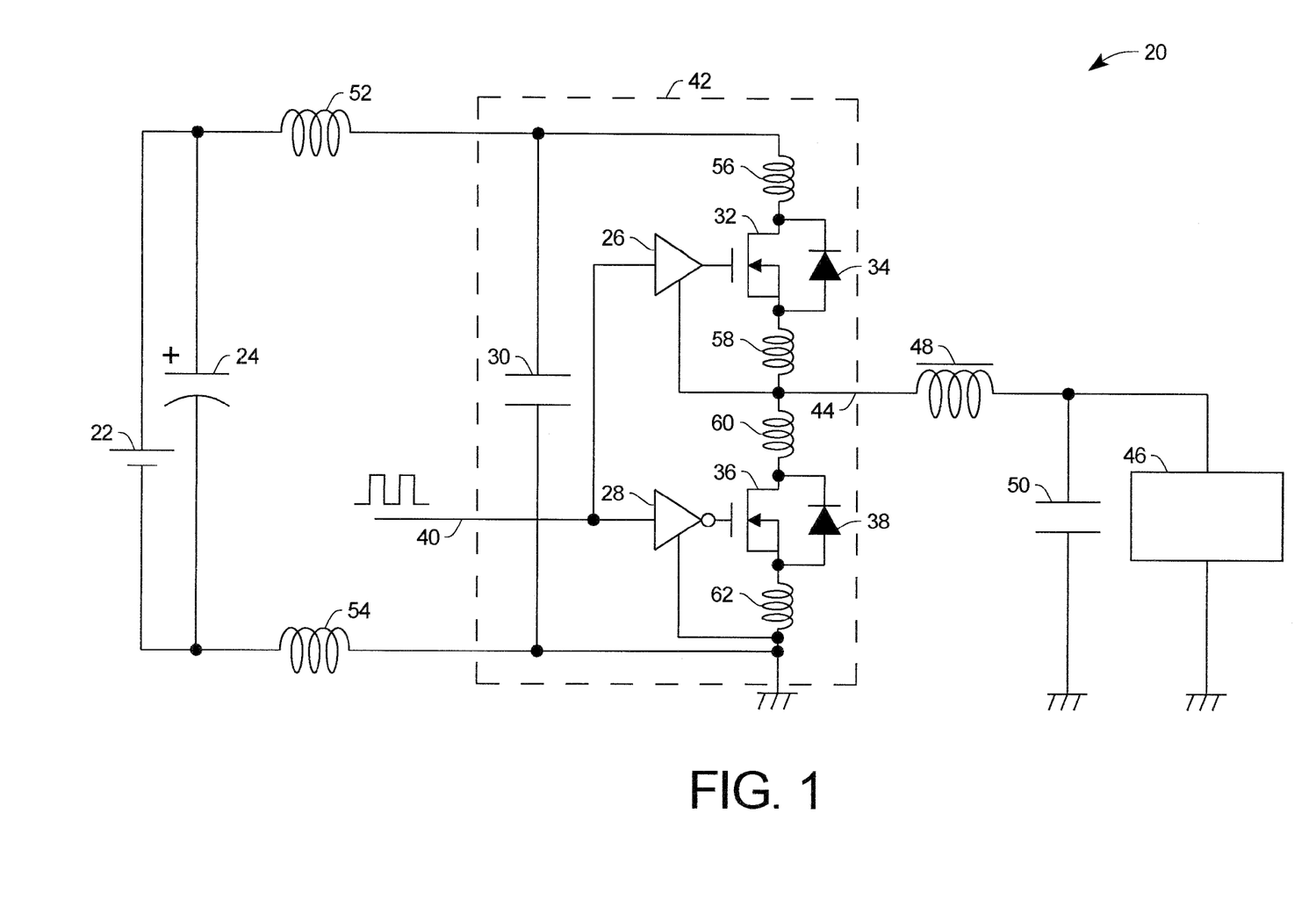
FIG. 1 is a schematic diagram of a buck converter with a two capacitors across the supply voltage.

Turning now to the drawings, FIG. 1 is a simplified schematic diagram of a buck converter circuit 20 which includes a supply voltage source 22, a supply voltage capacitor 24, two MOSFET driver circuits 26 and 28, an integrated modular capacitor 30, a high side MOSFET 32 and integral diode 34, a low side MOSFET 36 and integral diode 38, the gates of which are connected to the MOSFET drivers 26 and 28, respectively. An input signal on line 40 controls the MOSFET drivers 26 and 28. The output of a buck converter module 42, indicated by the dashed box, on line 44 is coupled to a load 46 through an inductor 48. The load 46 is in parallel with a load capacitor 50. The buck converter module 42 includes the components of one embodiment of an FLMP buck converter with a molded capacitor according to the present invention. Also shown in FIG. 1 are parasitic inductors 52, 54, 56, 58, 60, and 62. Parasitic inductors 52 and 54 are part of the connection between the supply voltage source 20 with its capacitor 24 and the buck converter module 42. The parasitic inductors 56-62 are in the high current paths in the buck converter module 42. The operation of a buck converter of the type shown in FIG. 1 is well known in the art.

The parasitic inductors 52 and 54 between the supply voltage source 22 and the buck converter module 42 are relatively large compared to the parasitic inductors 56-62 in side the buck converter module 42. The an integrated modular capacitor 30 stabilizes the supply voltage inside the buck converter module 42 by attenuating the supply voltage fluctuations resulting from the parasitic inductors 52 and 54.

Figure 2A:
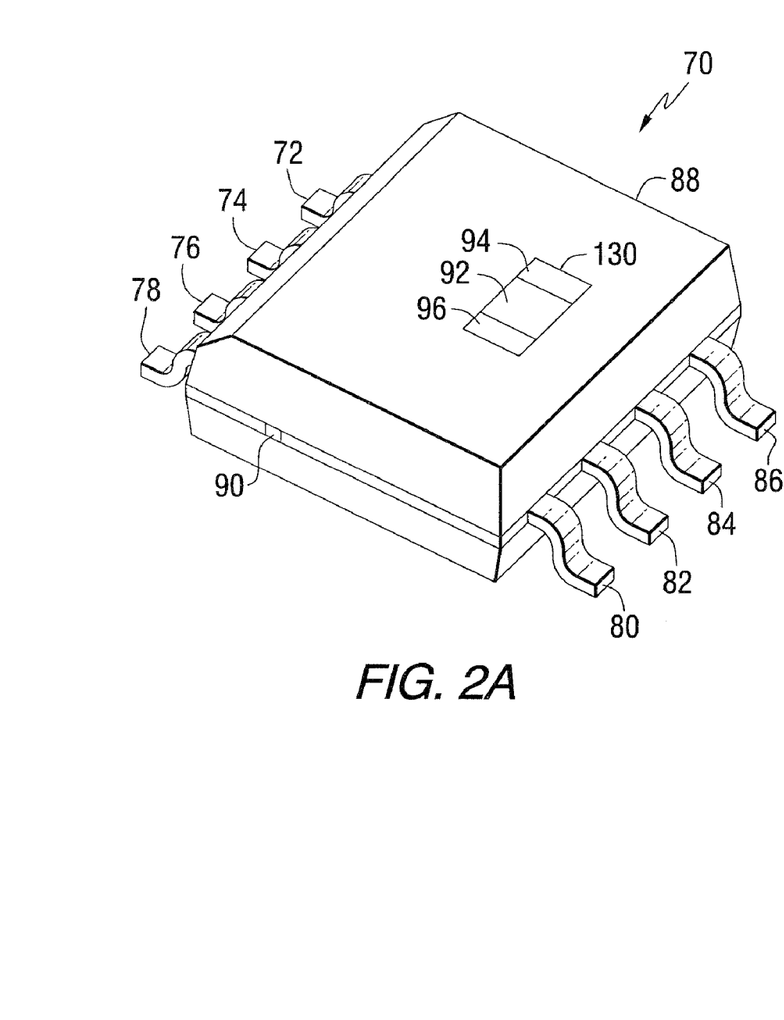
FIGS. 2A and 2B are respective top and bottom isometric views of a flip chip leaded and molded (FLMP) buck converter with an integral molded capacitor according to one embodiment of the present invention.
Figure 2B:
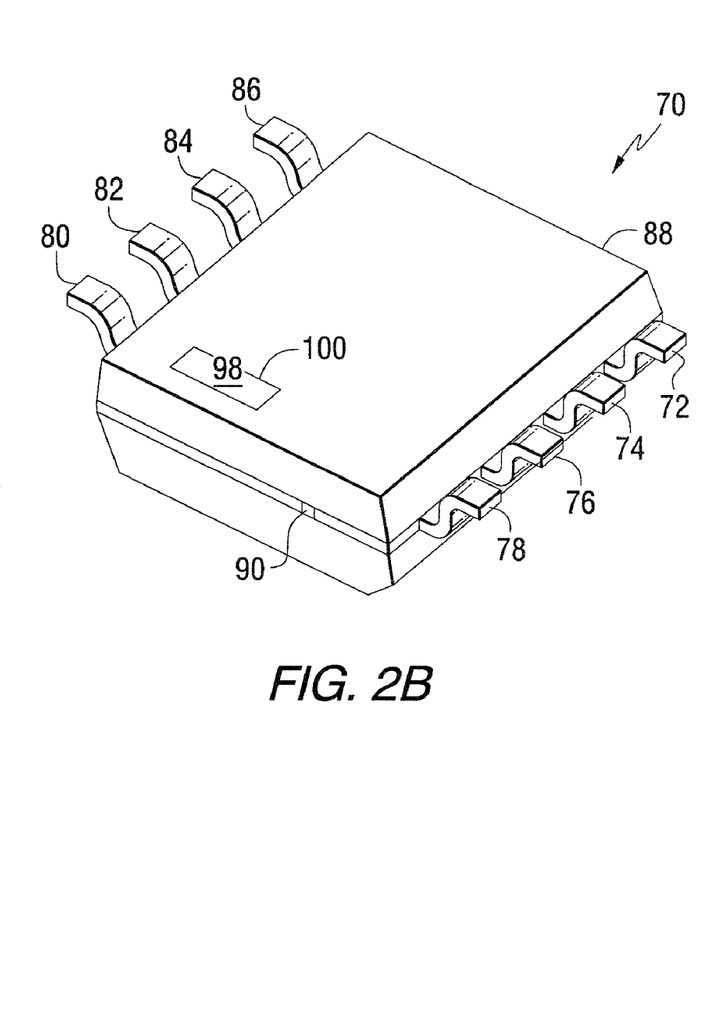

FIGS. 2A and 2B are respective top and bottom isometric views of a flip chip leaded and molded (FLMP) buck converter 70 with an integral molded capacitor 130 according to one embodiment of the present invention. The FLMP shown in the drawings is a SO-8 FLMP package, although those skilled in the art will understand that the present invention is applicable to many other types of molded semiconductor packages. The integral molded capacitor 130 corresponds to the an integrated modular capacitor 30 shown in FIG. 1. The FLMP buck converter 70 has eight external leads, 72, 74, 76, 78, 80, 82, 84, and 86 and is molded with an encapsulating material 88. The top of the integral molded capacitor 130 is visible in FIG. 2A along with an end 90 of one tie bar. The integral molded capacitor 130 contains a dielectric material 92 separated by two capacitor plates 94 and 96. An end 98 of a first clip 100 is visible in FIG. 2B together with the end 90 of the tie bar.

Figure 3A:
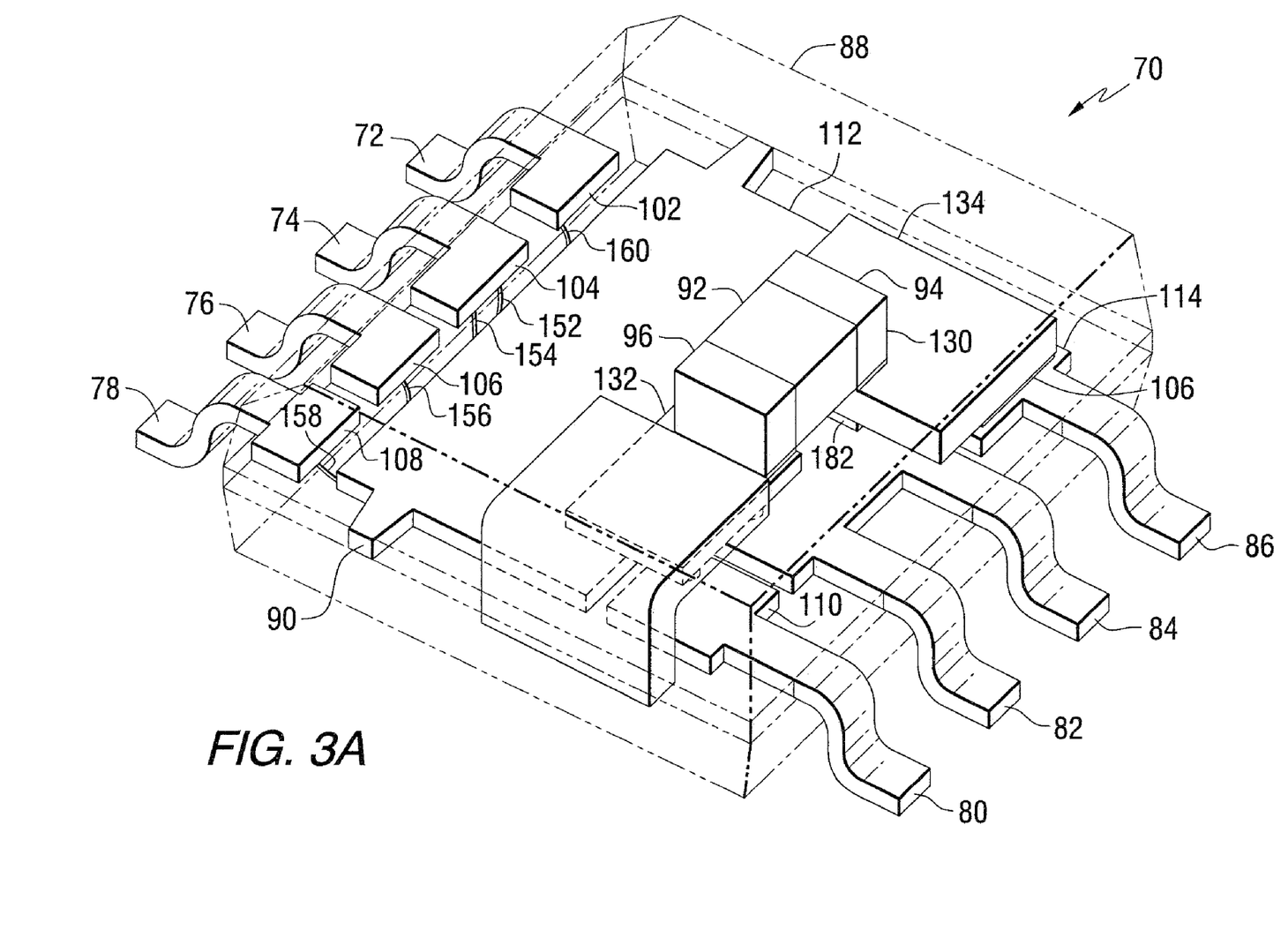
FIGS. 3A and 3B are FIGS. 2A and 2C, respectively, with the molding material shown in the translucent outline.
Figure 3B:
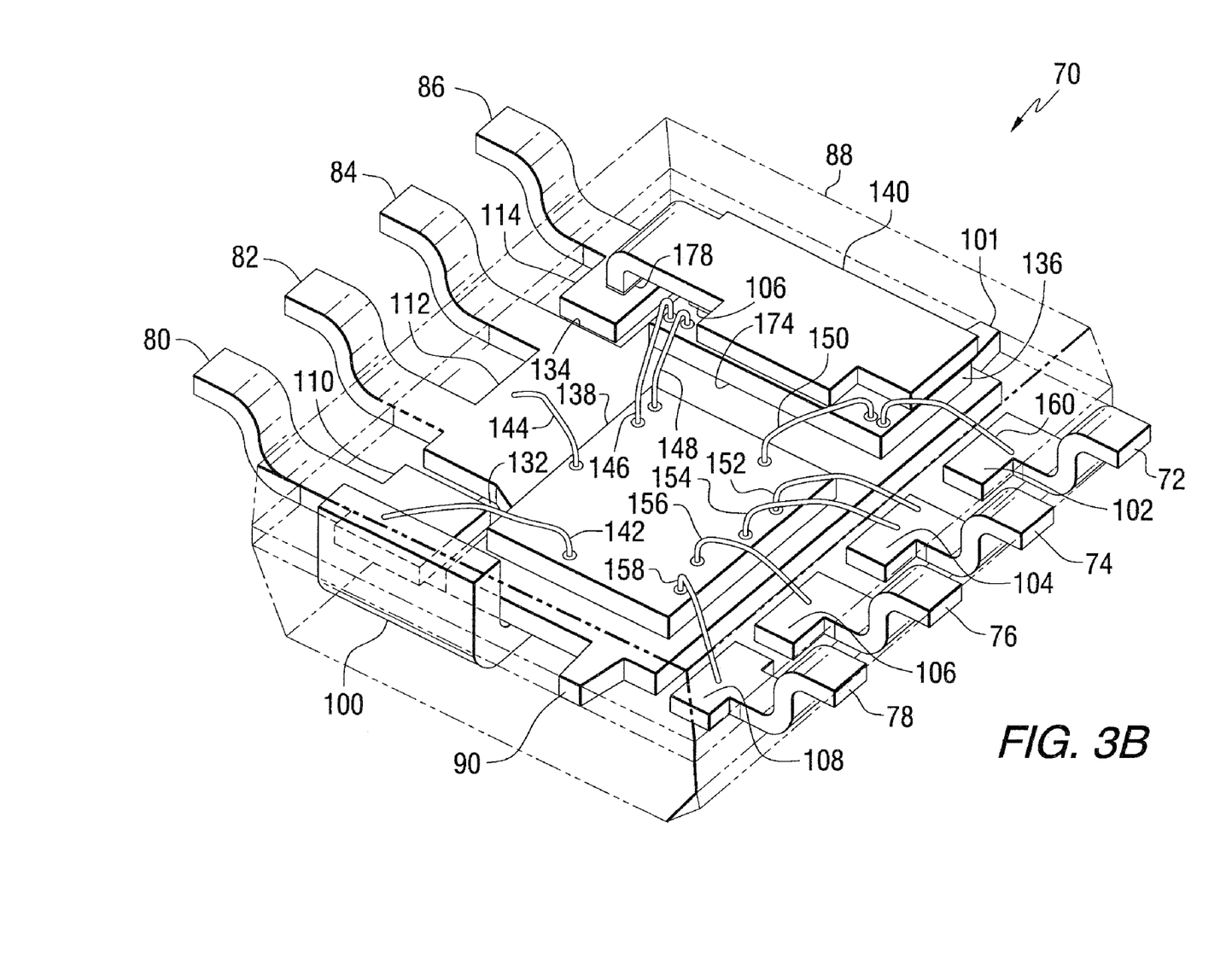
Figures 4A, 4C:
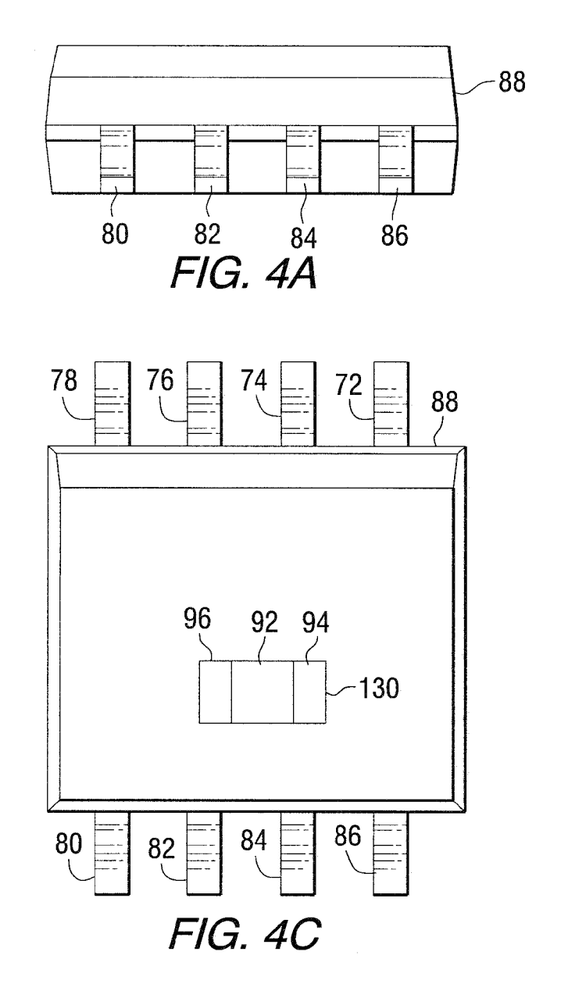
FIGS. 4A, 4B, 4C, and 4D are respective front, side, top, and bottom views of the FLMP buck converter shown in FIGS. 2A and 2B.
Figure 4B:
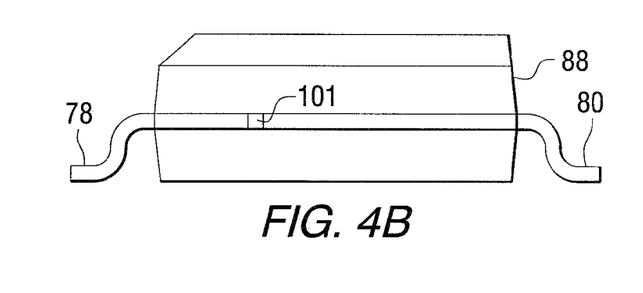
Figure 4D:
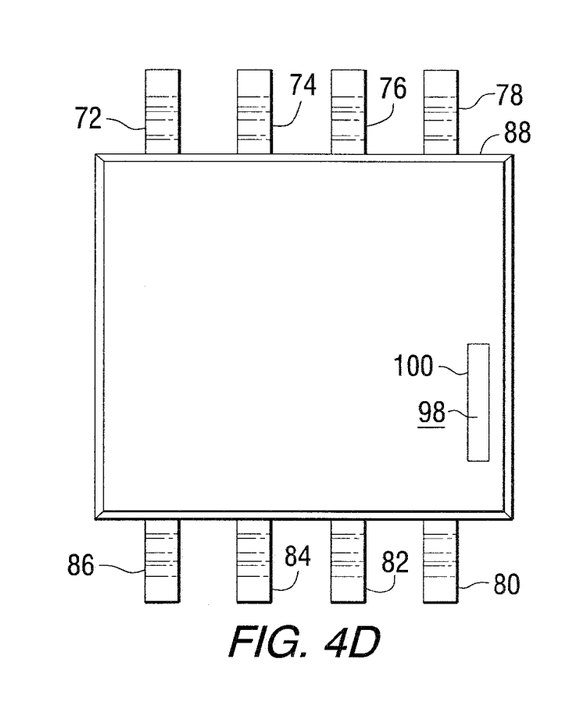

FIGS. 3A and 3B are FIGS. 2A and 2C, respectively, with the molding material shown in translucent outline. Each of the external leads 72-86 extend into the encapsulation material 88 to a component attachment section inside the encapsulation material 88 that is wider than the external leads 72-86 for connection to wire bonds and components inside the FLMP buck converter 70. External leads 72, 74, 76, 78, and 80 have corresponding component attachment sections 102, 104, 106, 108, and 110, respectively. External leads 82 and 84 share a large component attachment section 112, and external lead 86 has a component attachment section 114.

A high side transistor 132 is flip chip bonded to the component attachment sections 110 and 112, with the gate solder bump attached to the top of the component attachment section 110 and the source solder bumps attached to the top of the component attachment section 112. Transistor 132 corresponds to transistor 32 in FIG. 1, and thus external lead 80 corresponds to the gate of the high side transistor 32, and the external leads 82 and 84 correspond to the output line 44 in FIG. 1. The first clip 100 is bonded to the drain of transistor 132, and bends at a 90° angle such that end 98 is exposed on the bottom of the FLMP buck converter 70, and corresponds to the connection of the buck converter module 42 to the positive supply terminal of voltage source 22 in FIG. 1. The end 98 of the first clip 100 is thus a leadless contact for the FLMP buck converter 70.

Also attached to the drain of the high side transistor 132 is the plate 96 of the integral molded capacitor 130. The other plate 94 of the integral molded capacitor 130 is attached to the top of a copper block 134. The bottom of the copper block is attached to, but electrically isolated from, the top of the component attachment section 112. The bottom of the copper block 134 is attached to, and electrically connected to, the top of the component attachment section 114 which is integral with the external lead 86. The external lead 86 corresponds to the connection of the buck converter module 42 to the negative terminal of the voltage supply source 22 in FIG. 1.

Die bonded to the bottom of the component attachment section 114 is a low side transistor 136, corresponding to the low side transistor 36 shown in FIG. 1, and MOSFET driver integrated circuit 138 which controls the gate voltages on the high side transistor 132 and the low side transistor 136. A second clip 140 is attached to, and forms an electrical connection between, the source of the low side transistor 136 and the bottom of the component attachment section 114. Since the bottom of the component attachment section 114 is higher than the source contact of the low side transistor 136, the second clip 140 also has a 90° with the end of the second clip 140 attached to the bottom of the component attachment section 114.

In the embodiment shown in FIGS. 3A and 3B the MOSFET driver integrated circuit 138 has 9 wire bond wires 142, 144, 146, 148, 150, 152, 154, 156, and 158 bonded to it with an additional bond wire 160 connecting the gate of the low side transistor 136 to the component attachment section 102. Thus external lead 72 is connected to the gate of the low side transistor 136.

FIGS. 4A, 4B, 4C, and 4D are respective front, side, top, and bottom views of the FLMP buck converter 70 shown in FIGS. 2A and 2B.

Figure 5A:
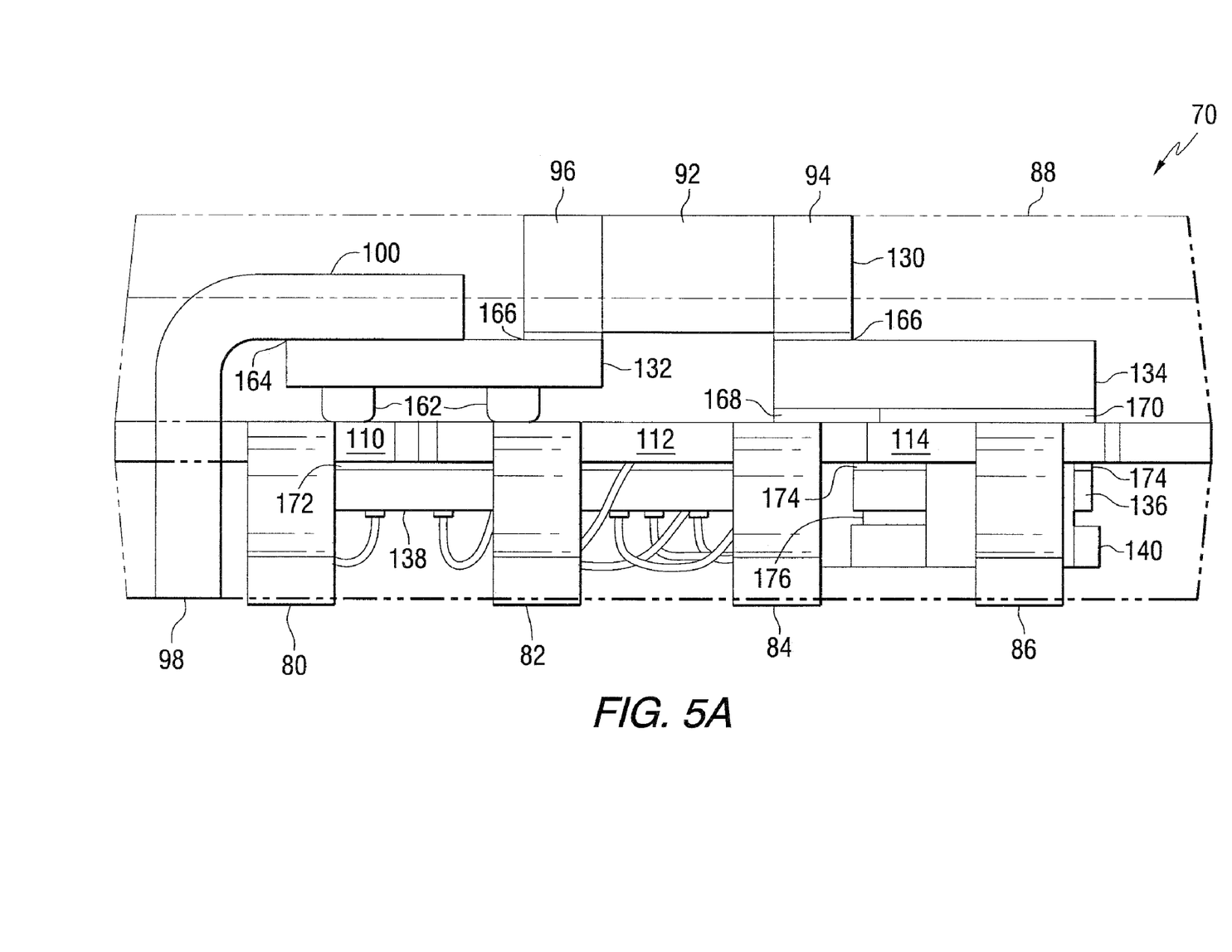
FIGS. 5A, 5B, 5C, and 5D are FIGS. 4A, 4B, 4C, and 4D, respectively, with the molding material shown in the translucent outline.
Figure 5B:
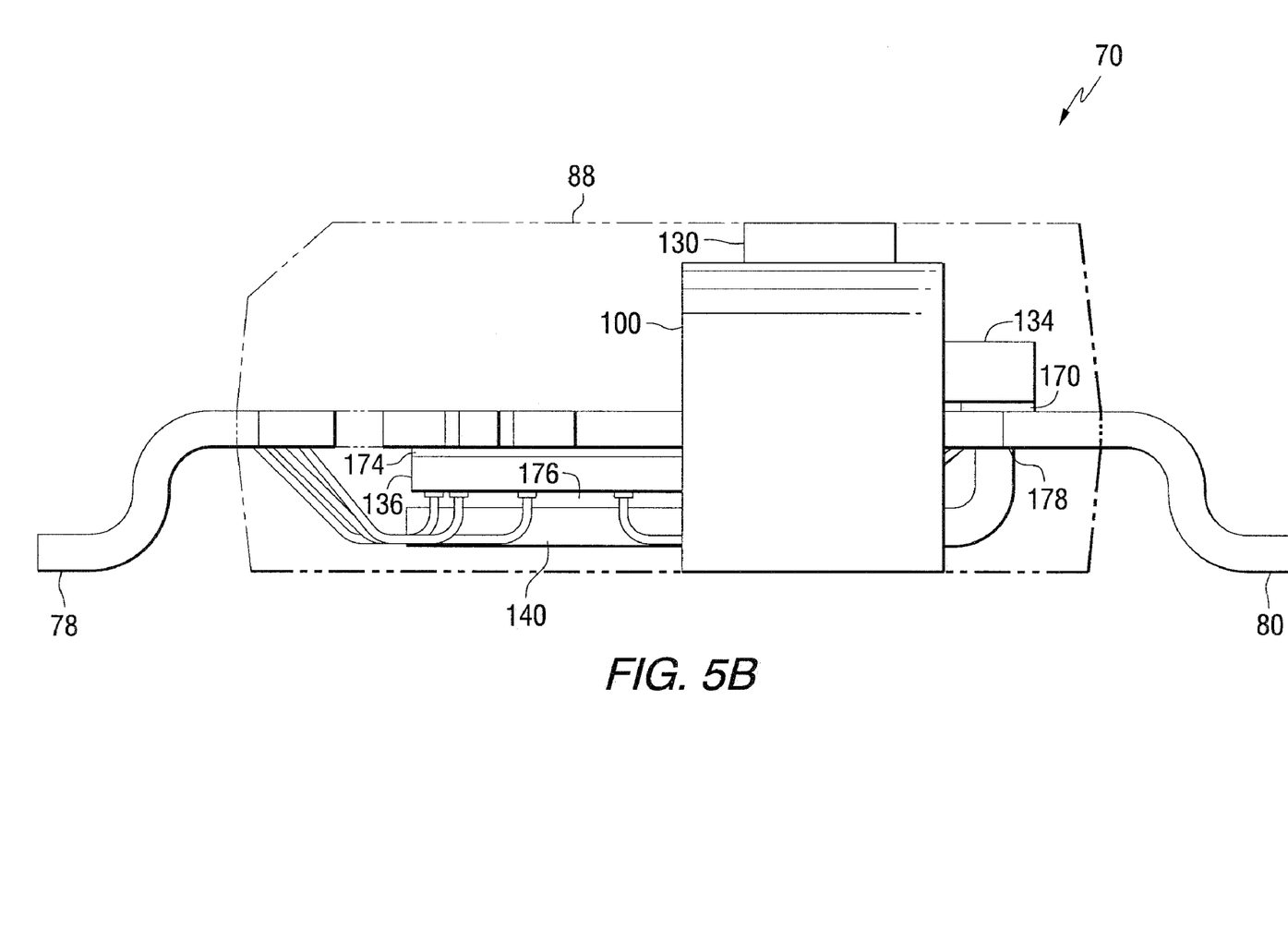
Figure 5C:
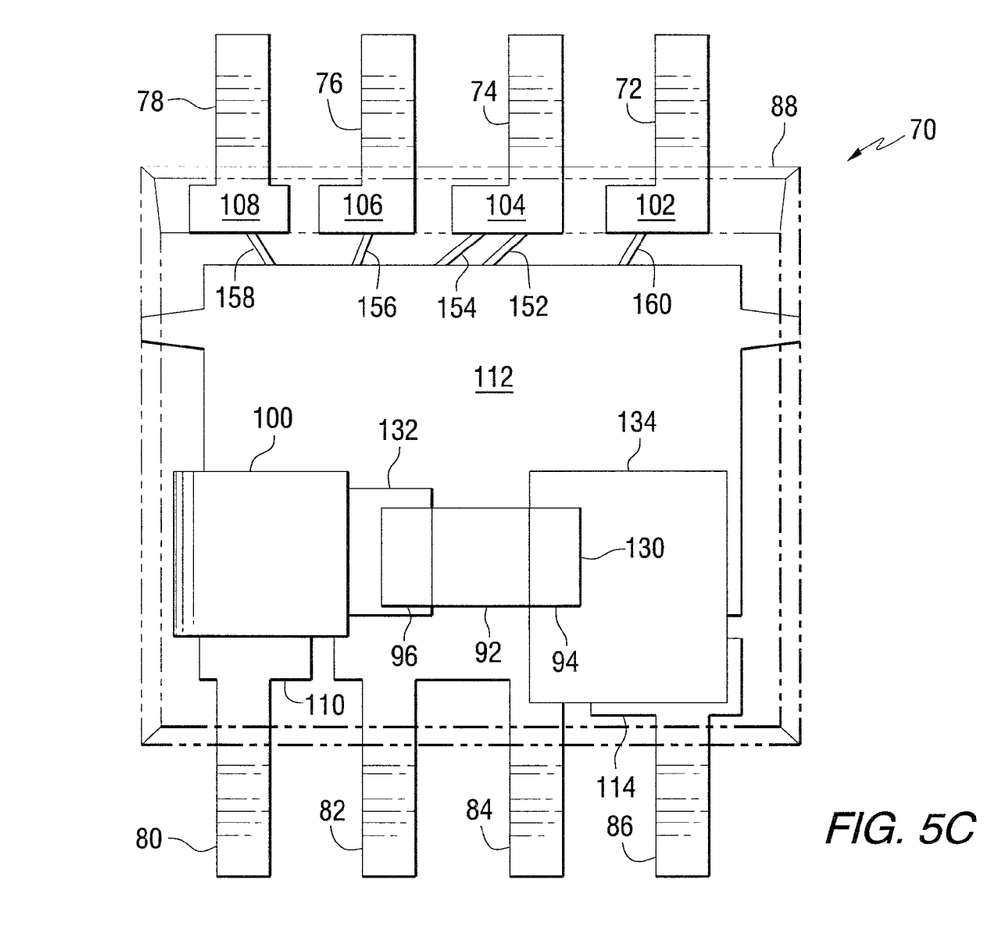
Figure 5D:
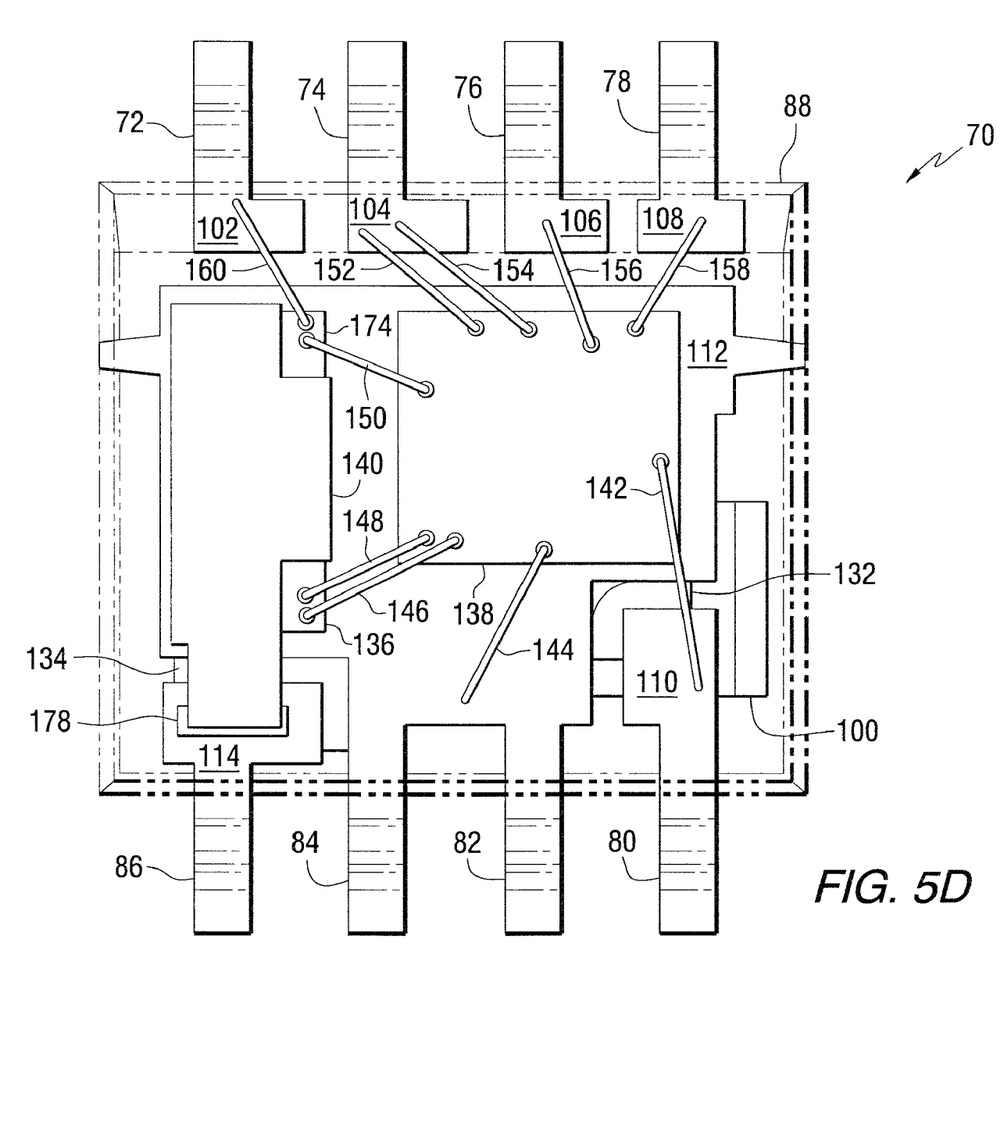

FIGS. 5A, 5B, 5C, and 5D are FIGS. 4A, 4B, 4C, and 4D, respectively, with the molding material shown in translucent outline. FIG. 5A shows the materials used to attach the various components of the FLMP buck converter 70 together. As stated above, the high side transistor 132 is flip chip bonded to the component attachment sections 110 and 112. Solder bumps 162 formed on the high side transistor 132 when the transistor is fabricated are shown in FIG. 5A. The first clip 100 may be attached to the top of the high side transistor 132 using low temperature solder 164. Alternatively, conductive epoxy may be used for the material 164. Similarly the integral molded capacitor may be attached to the top of the high side transistor 132 and the top of the copper block 134 using low temperature solder 166 with conductive epoxy as an alternative. The bottom of the copper block 134 may be attached to the component attachment section 112 using non-conductive epoxy 168 to insulate the copper block 134 from the component attachment section 112. The copper block may be soldered to the component attachment section 114 using a solder layer 170 to provide an electrical connection from the plate 94 of the integral molded capacitor 130 to the external lead 86 and to the source of the low side transistor 136. The MOSFET driver integrated circuit 138 is die bonded to the component attachment section 112 using bonding material 172 which may be non-conductive adhesives such as non-conductive epoxy. Similarly, the low side transistor 136 is die bonded to the component attachment section 112 using bonding material 174 which may be solder or conductive epoxy. The second clip 140 is soldered to the source of the low side transistor 136 using low temperature melting solder 176, and to the component attachment section 114 using solder 178.

Figure 6A:
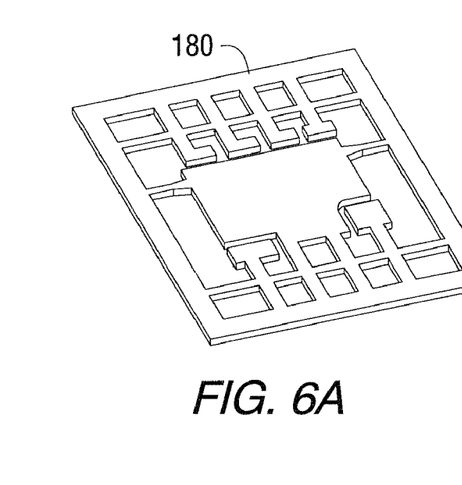
FIGS. 6A, 6B, 6C, 6D, 6E, and 6F are isometric views of selected manufacturing stages of one method of making the FLMP buck converter shown in FIG. 2A.
Figure 6B:
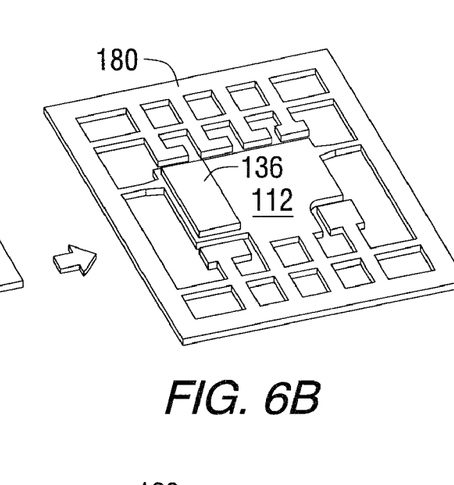
Figure 6C:
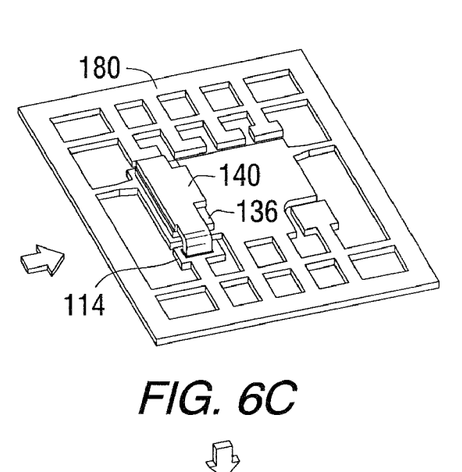
Figure 6D:
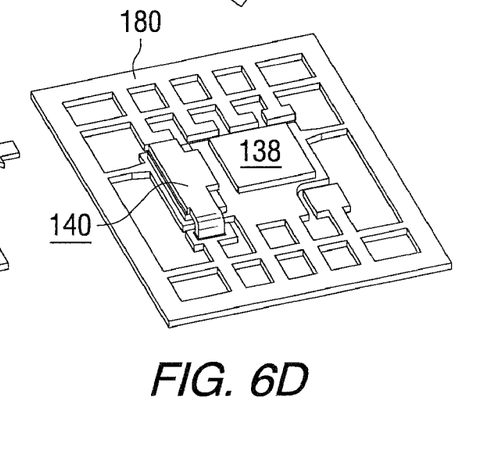
Figure 6E:
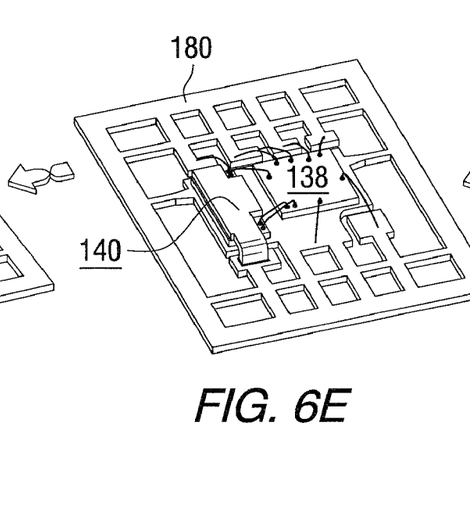
Figure 6F:
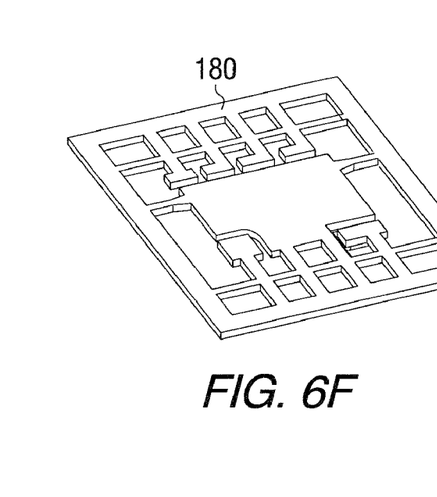

FIGS. 6A-6F are isometric views of selected manufacturing stages of one method of making the FLMP buck converter 70. The bottom of a leadframe blank 180 is shown in FIG. 6A. The low side transistor 136 is die bonded to the component attachment section 112 in FIG. 6B using the die bond material 174. After solder paste 176 and 178 has been applied to a section of the source contact of the low side transistor 136 and to the component attachment section 114 respectively, the second clip 140 is positioned over the solder paste 176 and 178, and then heat is applied to reflow the solder paste as shown in FIG. 6C. In FIG. 6D the MOSFET driver integrated circuit 138 has been die bonded to the component attachment section 112 using the die bond material 172. The wire bonds 142-160 are then attached as shown in FIG. 6E, and the leadframe 180 is subsequently flipped over as shown in FIG. 6F in preparation for attaching the remaining components of the FLMP buck converter 70 according to the process steps shown in FIGS. 7A-7F.

Figure 7A:
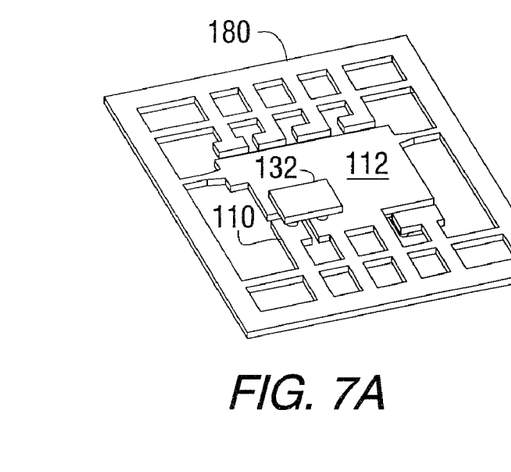
FIGS. 7A, 7B, 7C, 7D, 7E, and 7F are isometric views of additional selected manufacturing stages of one method of making the FLMP buck converter shown in FIG. 2A.
Figure 7B:
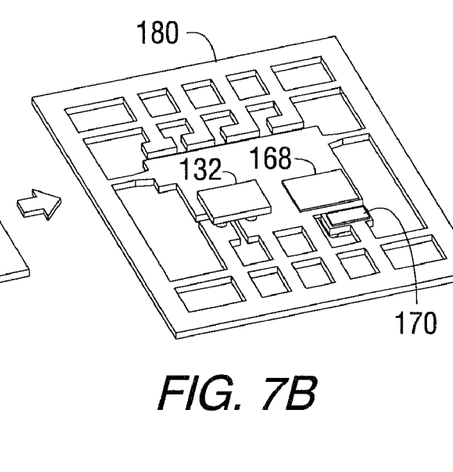
Figure 7C:
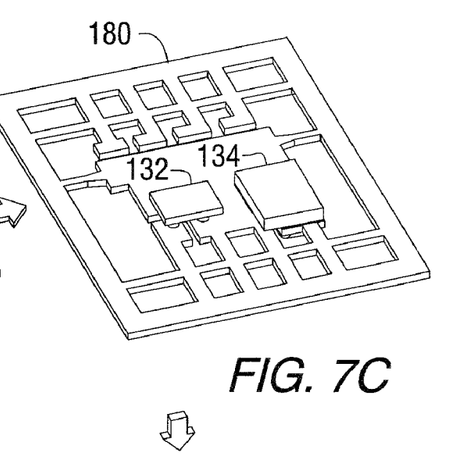
Figure 7D:
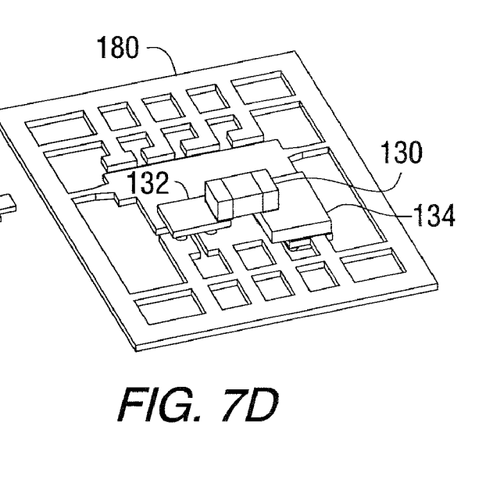
Figure 7E:
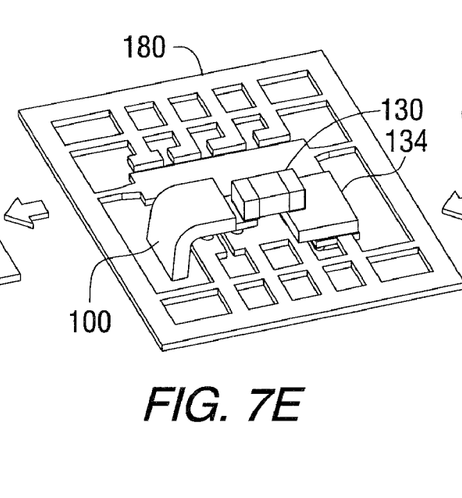
Figure 7F:
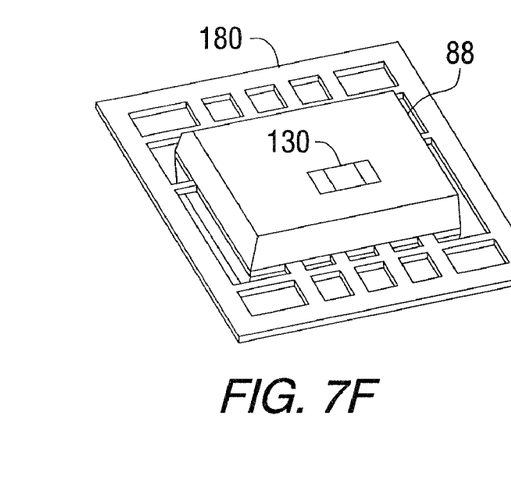

FIGS. 7A-7F are isometric views of additional selected manufacturing stages of one method of making the FLMP buck converter 70. In FIG. 7A the high side transistor 132 has been flip chip bonded to the component attachment sections 112 and 110 with the source of the high side transistor 132 attached to the component attachment section 112, and the gate of the high side transistor 132 attached to the component attachment section 110. The low temperature melting solder (or conductive adhesives) 170 is printed on the component attachment section 114 and the non-conductive epoxy 168 is attached to the component attachment section 112 as shown in FIG. 7B. In FIG. 7C the copper block 134 has been attached to the component attachment sections 114 and 112. The low temperature melting solder (or conductive adhesives) 166 is attached to portions of the top of the high side transistor 132 and the copper block 134, and the integral molded capacitor 130 is attached to the top sides of the high side transistor 132 and the copper block 134 as shown in FIG. 7D. FIG. 7E shows the assembly after the low temperature melting solder (or conductive adhesives) 164 has been applied to an exposed portion of the top of the high side transistor 132, and the first clip 100 has been attached to the high side transistor 132. Then a second solder reflow for the low temperature melting solder or cure of the conductive adhesives is performed. The assembly is then molded as shown in FIG. 7F. The top of the integral molded capacitor 130 is exposed on the top on assembly and the end 98 of the first clip 100 is exposed at the bottom of the assembly. The leadframe 180 is then trimmed and the external leads 72-86 are formed to complete the assembly of the FLMP buck converter 70.

Figure 8:
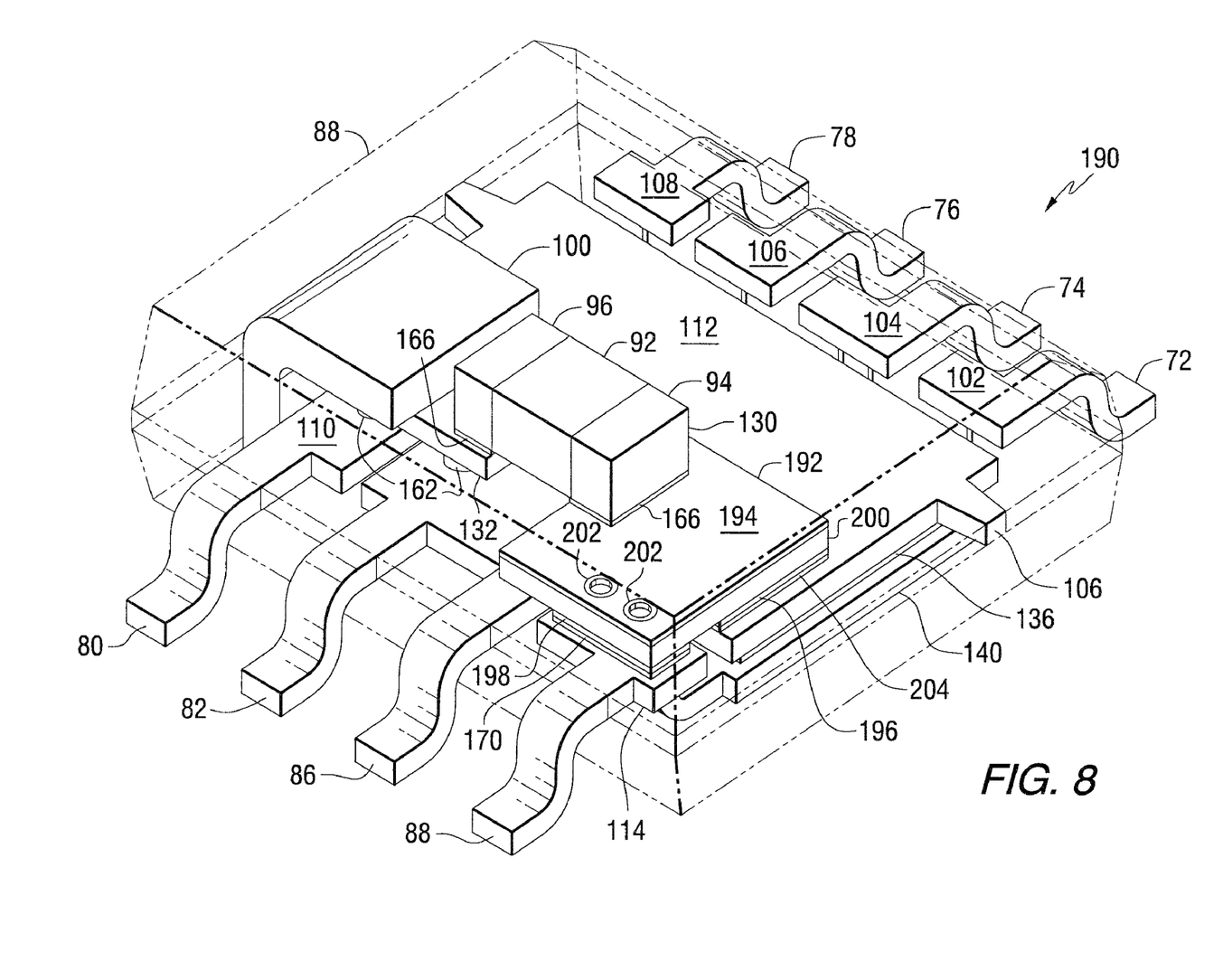
FIG. 8 is a top isometric view of a FLMP buck converter with an integral molded capacitor with the molding material shown in outline according to another embodiment of the present invention.
Figure 9A:
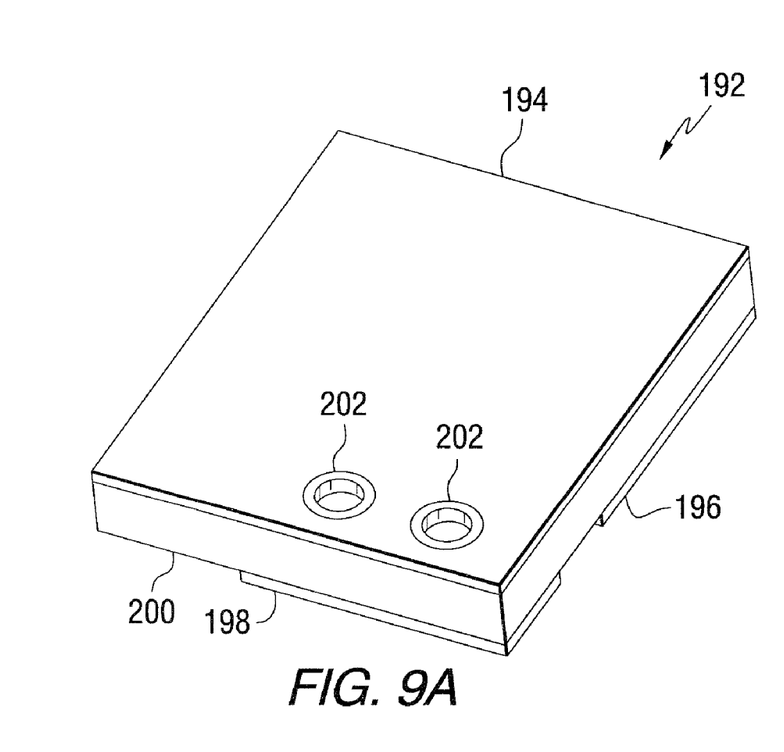
FIGS. 9A and 9B are isometric views of the BT or FR4 board shown in FIG. 8.
Figure 9B:
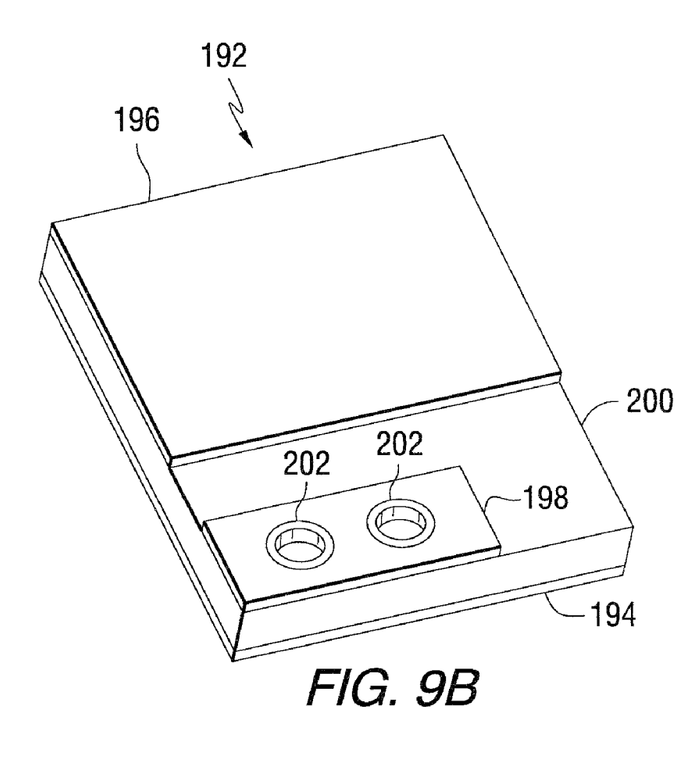

FIG. 8 is a top isometric view of a FLMP buck converter 190 with an integral molded capacitor with the molding material shown in outline according to another embodiment of the present invention. In the FLMP buck converter 190, the copper block of the FLMP buck converter 70 has been replaced with a bismaleimide-triazine (BT) or flame retardant 4 (FR4) board 192. The BT board 192 has a top metal plate 194, such as copper, and two bottom metal plates, a larger bottom metal plate 196 and a smaller bottom metal plate 198, which may also be copper, with bismaleimide-triazine or flame retardant 4 200 separating the metal plates 194, 196, and 198. Two vias 202 form a connection between the top metal plate 194 and the bottom smaller metal plate 198, and the large bottom metal plate 196 is electrically isolated from the metal plates 194 and 198. See FIGS. 9A and 9B. The BT or FR4 board is attached to the component attachment sections 114 and 112 with the larger bottom metal plate 196 soldered (or bonded) to the component attachment section 112 with low temperature melting solder (or conductive adhesives) 204, and the smaller bottom metal plate 198 soldered (or bonded) to the component attachment section 114 using the low temperature melting solder (or conductive adhesive) 170. The top metal plate 194 is attached to the integral molded capacitor 130 using the low temperature melting solder (or conductive adhesive) 166.

Figure 10A:
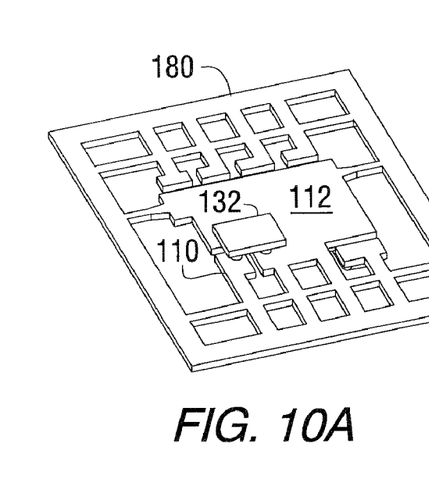
FIGS. 10A, 10B, 10C, 10D, 10E, and 10F are isometric views of selected manufacturing stages of one method of making the FLMP buck converter shown in FIG. 8.
Figure 10B:
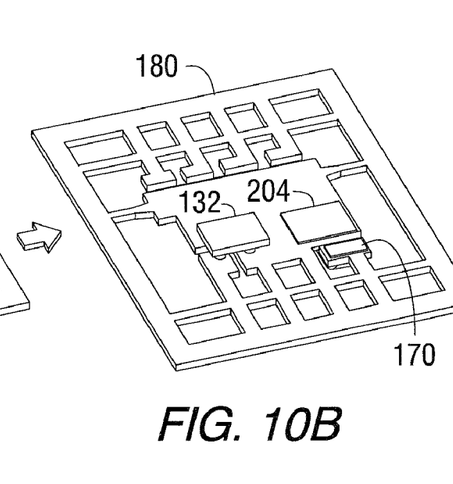
Figure 10C:
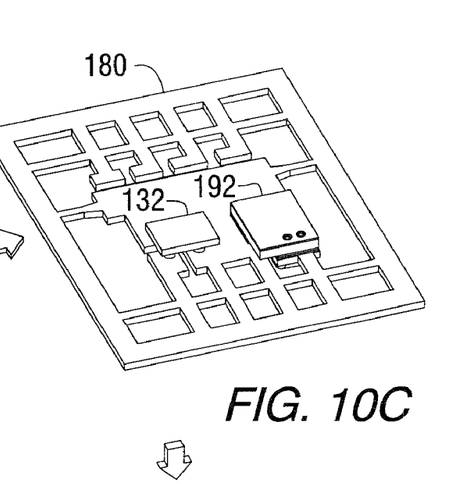
Figure 10D:
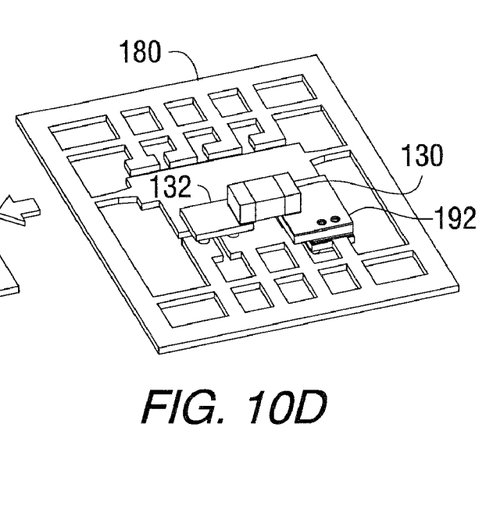
Figure 10E:
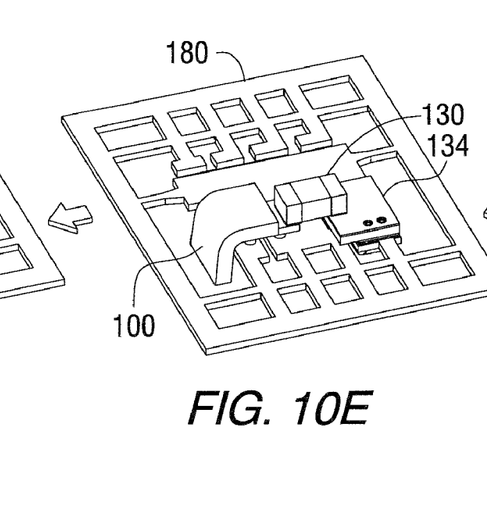
Figure 10F:
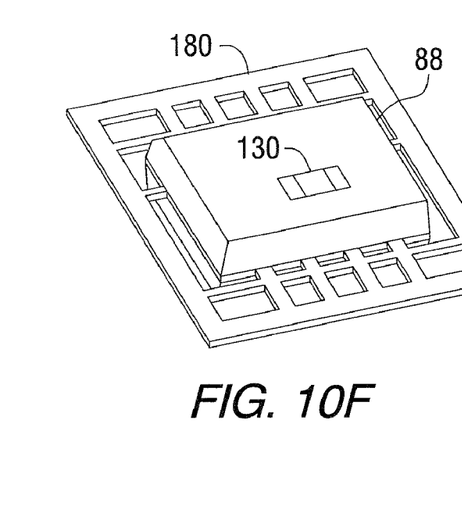

The assembly of the FLMP buck converter 190 begins with the attachment of the components to the bottom of the leadframe 180 as shown in FIGS. 6A-6F. FIGS. 10A-10F are isometric views of selected manufacturing stages of one method of making the FLMP buck converter 190. FIG. 10A is the same as FIG. 7A. In FIG. 10B, the non-conductive epoxy 168 of FIG. 7B has been replaced by solder (or conductive adhesives) 204 in FIG. 10B. In FIGS. 10C-10E, the copper block 134 shown in FIGS. 7C-7E has been replaced with the BT or FR4 board 192.

Those skilled in the art will understand that the MOSFET driver integrated circuit 138 can be of many different designs, and therefore there has been no attempt to correlate the connections to the MOSFET driver circuits 26 and 28 shown in FIG. 1 to the FLMP buck converters 70 and 190. The integral molded capacitor 130 can be a custom capacitor, or can be a chip capacitor that is widely used in the electronics industry. In addition, the integral molded capacitor may not be exposed through the encapsulation material in some embodiments of the present invention.

While the invention has been described with reference to particular embodiments, it will be understood by those skilled in the art that various changes may be made and equivalents may be substituted for elements thereof without departing from the scope of the invention. In addition, many modifications may be made to adapt a particular situation or material to the teachings of the invention without departing from the scope of the invention.

Therefore, it is intended that the invention not be limited to the particular embodiments disclosed as the best mode contemplated for carrying out this invention, but that the invention will include all embodiments falling within the scope and spirit of the appended claims.

The invention claimed is:

1. An encapsulated buck converter module with an integral capacitor comprising:
    a) a low side transistor and a control integrated circuit bonded to a first component attachment section on a first side of a leadframe;
    b) a first clip between a source of said low side transistor and a second component attachment section;
    c) a source contact of a high side transistor attached to said first component attachment section on a second side of said leadframe with a gate contact of said high side transistor attached to a third component attachment section;
    d) a conductive member attached to said first component attachment section and said second component attachment section on said second side of said leadframe wherein said first side of said conductive member attached to said second conductive member forms a highly conductive path with a portion of a second side of said conductive member while any portion of said first side of said conductive member attached to said first component attachment section is insulated from said first side of said conductive member;
    e) a first plate of a capacitor attached to a drain contact of said high side transistor and a second plate of said capacitor attached to said second side of said conductive member; and f) means for forming an external connection to said drain contact of said high side transistor.

2. The encapsulated buck converter module set forth in claim 1 wherein said means for forming an external connection comprises a second clip attached to said drain of said high side transistor.

3. The encapsulated buck converter module set forth in claim 1 wherein said conductive member is a metal plate which is attached to said first component attachment section by a non-conductive bonding material.

4. The encapsulated buck converter module set forth in claim 1 where said conductive member comprises a first plate bonded to one side of an insulator with second and third plates bonded to an opposite side of said insulator with at least one via electrically connecting said first metal plate to said second metal plate, and said third metal plate is attached only to said first component attachment section and said second plate is attached only to said second component attachment section.

5. The encapsulated buck converter module set forth in claim 1 said first clip has a substantially 90 degree bend wherein a flat portion of a major surface of said first clip is attached to said source of said low side transistor and an end of said first clip is attached to said second component attachment section.

6. The encapsulated buck converter module set forth in claim 1 wherein said first side of said leadframe is closer to a bottom of said encapsulated buck converter module than said second side of said leadframe.

7. The encapsulated buck converter module set forth in claim 1 wherein each of said component attachment sections is integral with an external lead.

8. The encapsulated buck converter module set forth in claim 2 wherein said second clip has a substantially 90 degree bend.

9. The encapsulated buck converter module set forth in claim 8 wherein an end of said second clip is not encapsulated and forms said external connection.

10. A method for forming an encapsulated buck converter module with an integral capacitor comprising the steps of:
   a) die bonding a low side transistor and a control integrated circuit to first component attachment section on a first side of a leadframe;
   b) attaching a first clip between a source of said low side transistor and a second component attachment section;
   c) attaching wirebonds to said control integrated circuit, low side transistor and the component attachment sections of leadframe;
   d) attaching on a second side of said leadframe a source contact of a high side transistor to said first component attachment section and a gate contact of said high side transistor to a third component attachment section;
   e) attaching to said second side of said leadframe a first side of a conductive member to said first component attachment section and said second component attachment section wherein said first side of said conductive member attached to said second conductive member forms a highly conductive path with a portion of a second side of said conductive member while any portion of said first side of said conductive member attached to said first component attachment section is insulated from said first side of said conductive member;
   f) attaching a first plate of a capacitor to a drain contact of said high side transistor and a second plate of said capacitor to said second side of said conductive member;
   g) attaching a first end of a second clip to said drain contact of said high side transistor; and
   h) encapsulating said leadframe is such a manner that part of said leadframe and a second end of said second clip is not encapsulated.

11. The method set forth in claim 10 wherein said conductive member is a metal plate which is attached to said first component attachment section by a non-conductive bonding material.

12. The method set forth in claim 10 where said conductive member comprises a first plate bonded to one side of an insulator with second and third plates bonded to an opposite side of said insulator with at least one via electrically connecting said first metal plate to said second metal plate, and said third metal plate is attached only to said first component attachment section and said second plate is attached only to said second component attachment section.

13. The method set forth in claim 10 said first clip has a substantially 90 degree bend wherein a flat portion of a major surface of said first clip is attached to said source of said low side transistor and an end of said first clip is attached to said second component attachment section.

14. The method set forth in claim 10 wherein said second clip has a substantially 90 degree bend.

15. The method set forth in claim 10 wherein said first side of said leadframe is closer to a bottom of said encapsulated buck converter module than said second side of said leadframe.

16. The method set forth in claim 10 wherein each of said component attachment sections is integral with an external lead.

* * * * *